United States Patent [19]
Berg et al.

[11] Patent Number: 6,030,234
[45] Date of Patent: Feb. 29, 2000

[54] TERMINAL PINS MOUNTED IN FLEXIBLE SUBSTRATES

[75] Inventors: Paul Christopher Berg, Batavia; Harry N. Etters, Plainfield; Duane M. Fencl, Countryside; Robert M. Fuerst, Maple Park; Fred Love Krehbiel, Chicago, all of Ill.

[73] Assignee: Molex Incorporated, Lisle, Ill.

[21] Appl. No.: 09/012,610

[22] Filed: Jan. 23, 1998

[51] Int. Cl.[7] .................................................. H01R 9/09
[52] U.S. Cl. ............................................. 439/67; 439/751
[58] Field of Search .................................. 439/67, 77, 68, 439/751

[56] References Cited

U.S. PATENT DOCUMENTS

| | | | |
|---|---|---|---|
| 3,670,294 | 6/1972 | Johnson et al. | 439/697 |
| 3,964,813 | 6/1976 | Pizzeck | 439/75 |
| 4,076,356 | 2/1978 | Tamburro | 439/426 |
| 4,691,971 | 9/1987 | Hahn | 439/78 |
| 4,691,979 | 9/1987 | Manska | 439/82 |
| 4,728,164 | 3/1988 | Lemmens et al. | 439/870 |
| 4,970,624 | 11/1990 | Arneson et al. | 361/398 |
| 5,133,673 | 7/1992 | Dijshoorn | 439/422 |
| 5,141,455 | 8/1992 | Ponn | 439/620 |
| 5,242,318 | 9/1993 | Plass | 439/620 |
| 5,266,054 | 11/1993 | Duncan et al. | 439/620 |
| 5,384,435 | 1/1995 | Fuerst et al. | 174/262 |
| 5,456,616 | 10/1995 | Fuerst et al. | 439/620 |
| 5,487,684 | 1/1996 | Schalk et al. | 439/715 |

*Primary Examiner*—Steven L. Stephan
*Assistant Examiner*—T C Patel
*Attorney, Agent, or Firm*—Stacey E. Caldwell

[57] ABSTRACT

An electronic device includes a flat flexible dielectric substrate less than 0.050 inch thick and having a generally round hole of a given diameter. A terminal pin is inserted into the round hole in the substrate. The pin includes at least one end section having a cross dimension less than the diameter of the hole in the substrate and an enlarged contact section adjacent the end section having a cross dimension greater than the diameter of the hole in the substrate adapted to make contact with the substrate. The difference between the cross sectional dimension of the enlarged contact section of the pin and the diameter of the round hole is between 7% and 67% of the diameter of the hole.

14 Claims, 4 Drawing Sheets

FIG. I (PRIOR ART)

TERMINAL PINS MOUNTED IN FLEXIBLE SUBSTRATES

FIELD OF THE INVENTION

This invention generally relates to the art of electrical connectors and, particularly, to an electronic device wherein terminal pins are electrically coupled through holes in a flat flexible circuit or substrate.

BACKGROUND OF THE INVENTION

A variety of electrical connectors are designed for utilization with a flat flexible circuit which may be mounted directly on the connector or connected in circuit with terminal pins on the connector. Generally, a flat flexible circuit includes a flat flexible dielectric substrate having one or more holes therein for receiving one or more terminal pins. A ductile conductive film or other circuit trace system is deposited on the substrate in an area at least about the hole or holes. The terminal pins are inserted into the holes in the substrate to establish electrical and mechanical connections between the pins and the flat flexible circuit. Normally, each hole is smaller in diameter than a respective pin at the pin's widest portion. Alternatively, the pin may be punched through the flat flexible circuit to establish the electrical and mechanical connection therewith.

In order to assure good electrical and mechanical connections in these types of electronic devices or electrical connectors, solder or other adhesives often are used. For instance, in U.S. Pat. No. 4,970,624, dated Nov. 13, 1990 and assigned to the assignee of the present invention, uni-axial adhesive is deposited on the flexible circuit about the hole which is penetrated by the terminal pin. The adhesive includes a non-conductive base incorporating randomly spaced conductive particles. When the terminal pin is forced through the adhesive, a portion of the adhesive is carried with the terminal pin between the pin and the flat flexible circuit. The carried portion of the adhesive is compressed for establishing contact between the conductive particles and, thereby, conductivity between the terminal pin and the flat flexible circuit, leaving the adhesive other than that portion in a non-conductive state. Such adhesives often are called "Z-axis" adhesives. These adhesives were developed to replace soldering techniques which require specific temperature resistant components and substrates.

Conductive adhesives are used in other applications involving flat flexible circuits. For instance, in U.S. Pat. No. 5,456,616, dated Oct. 10, 1995 and assigned to the assignee of the present invention, the connector housing is fabricated of a die cast metallic material, such as of magnesium, aluminum or the like. The ductile film on the flat flexible circuit is fabricated of a different metallic material, such as copper or the like and, in fact, may be plated with still a different metallic material such as a tin/lead alloy. The conductive film on the flat flexible circuit acts as a ground plane against the rear face of the connector housing. The housing has a plurality of pins which project through holes in the flat flexible circuit. Using a "Z-axis" adhesive between the housing pins and the flat flexible circuit not only is expensive, as described above, but the conductive interface between the different metal components is limited to the areas of pressure. Consequently, the '616 patent teaches the use of an omni-directional conductive adhesive deposited on the conductive film over the areas of the holes therein, the conductive adhesive expanding the conductive interface between the metal housing and the metal ground plane defined by the conductive film.

Although such uses of conductive adhesives, whether the adhesives are Z-axis adhesives or omni-directional adhesives, serve their intended purposes in certain applications, they are relatively expensive both in the cost of the adhesives as well as their methods of use. In addition, the use of either type of conductive adhesive is costly in terms of secondary operations and costs associated with the metal particles, not to mention the problem of clogging adhesive dispensers by the metallic particles.

Because of the problems associated with the use of conductive adhesives, a unique system was devised as disclosed in U.S. Pat. No. 5,384,435, dated Jan. 24, 1995 and assigned to the assignee of the present invention. That patent solves the problems associated with conductive adhesives by eliminating the adhesive altogether and establishing an electrical connection directly between the terminal pin and the flat conductor on the flat flexible substrate. The electrical interface is established by controlling various parameters between the pin and the substrate. In the system disclosed in the '435 and '616 patents, the terminal pin is generally round in cross-section, and the round pin is inserted into a generally round hole in the flat flexible substrate. Although this system has proven quite effective in certain applications, there continues to be a need for further improvements in other applications, and the present invention is directed to that end.

In certain applications, for example, it has been found that a generally rectangular cross-sectional pin is preferred due to increased column strength or maintaining dimensions between adjacent pins. However, other applications are more suitable for generally round pins, and therefore there is a need to effect a reliable electrical connection in a given application for a pin with a variety of cross-sectional shapes. However, generally speaking, any pin shape can create problems by causing skiving of the coatings or platings along the length of the pin during insertion into a flexible circuit. That is, the controlled interference fit between the smaller hole in the flexible circuit and the larger pin can create skiving of the plating on either the pin or the circuit traces of the substrate during the insertion or assembly of the pin through the circuit. This skiving action can create conductive plating debris which can become loose and interfere with an electrical connection and is therefore highly undesirable in electronic devices. Furthermore, the skiving reduces the solderability of the pin coating which is also undesirable. The present invention is directed to solving the problems of skiving of the plating of the pin or the circuit substrate during assembly of the substrate.

SUMMARY OF THE INVENTION

An object, therefore, of the invention is to provide a new and improved system for mounting electrical terminals, such as terminal pins, in a flat flexible circuit.

In the exemplary embodiment of the invention, an electronic device includes a flat flexible circuit which is less than 0.050 inch thick. The flexible circuit includes a substrate that has a generally round hole of a given diameter. Typically, a ductile conductive film is deposited on the substrate in an area at least about the hole. A terminal pin is inserted into the hole in the substrate. The terminal pin includes two end sections each having a generally uniform round or rectangular cross-section wherein the given cross dimension of the end sections defined by the diameter of the pin or between opposite diametral corners of the pin is less than the diameter of the hole in the substrate. The pin further includes an enlarged contact section located between the two end sections adapted to make electrical contact with the conductive film. The enlarged contact section has a polygonal cross section wherein the cross dimension between opposite diametral corners of the polygon or of the diameter defined by the outside dimensions of the polygon is greater than the diameter of the hole in the substrate. The terminal pin is inserted into the flexible circuit to a depth such that the enlarged contact portion of the pin is in contact with the conductive film of the flexible circuit, creating a "controlled meniscus" interface. The difference between the cross-dimension of the enlarged contact section of the pin and the diameter of the hole is on the order of 7 % to 67 % of the diameter of the hole. These parameters establish a good connection between the pin and the conductive film on the flexible circuit, and the geometry of the pin, with the end sections of reduced cross section, prevents undue skiving of the coating of the pin and flexible circuit.

As disclosed herein, the hole in the substrate can be prepunched, drilled, routed or laser cut. The substrate may be fabricated of a material such as polyimide, although other materials such as polyester and the like are appropriate. The ductile conductive film may be of copper or other conductive material. It is contemplated that the terminal pin and the ductile conductive film both can be plated with common or with dissimilar plating material.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
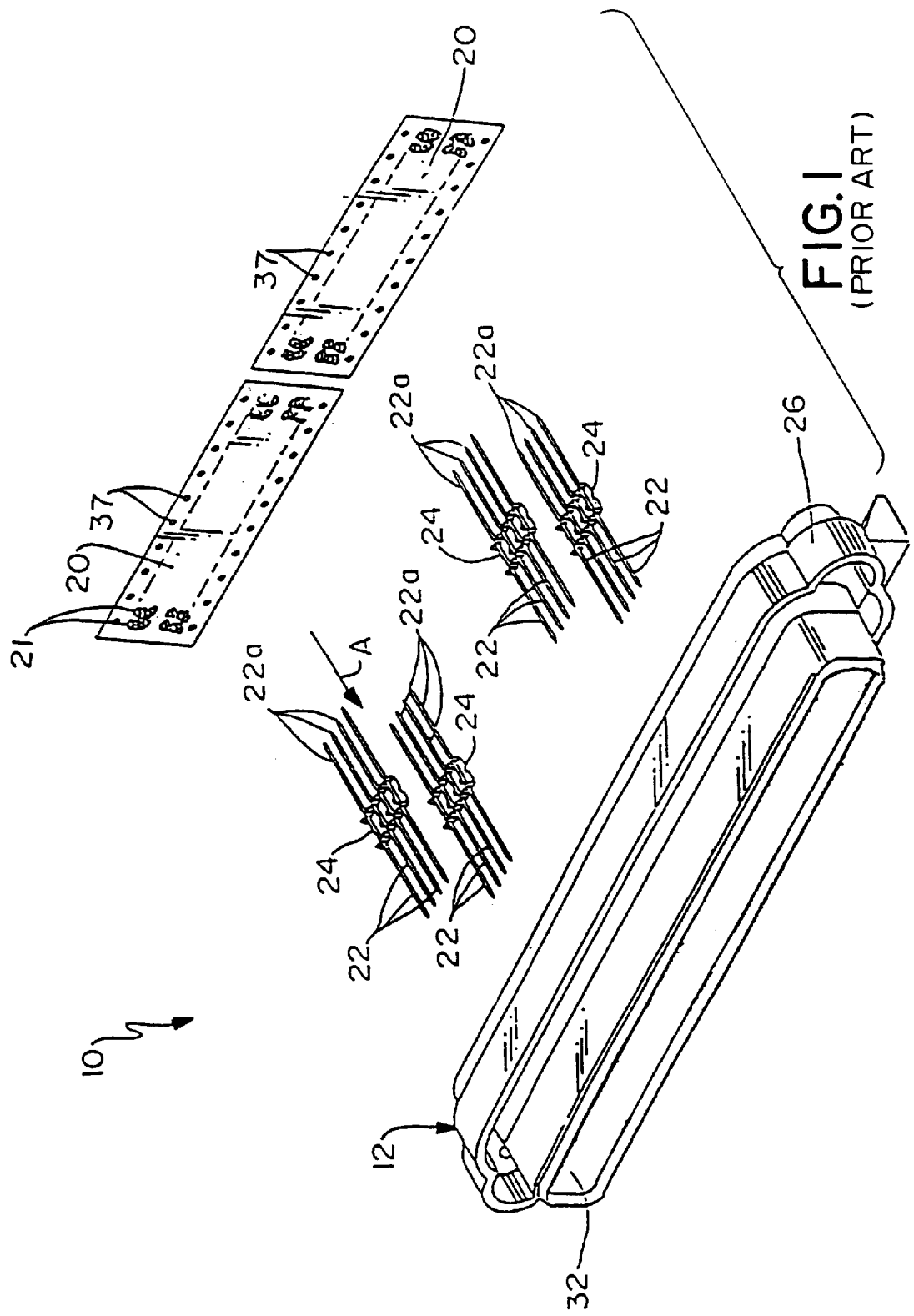
FIG. 1 an exploded perspective view of a multi-terminal filtered electrical connector assembly as described by the prior art and in which the invention is used.
Figure 2:
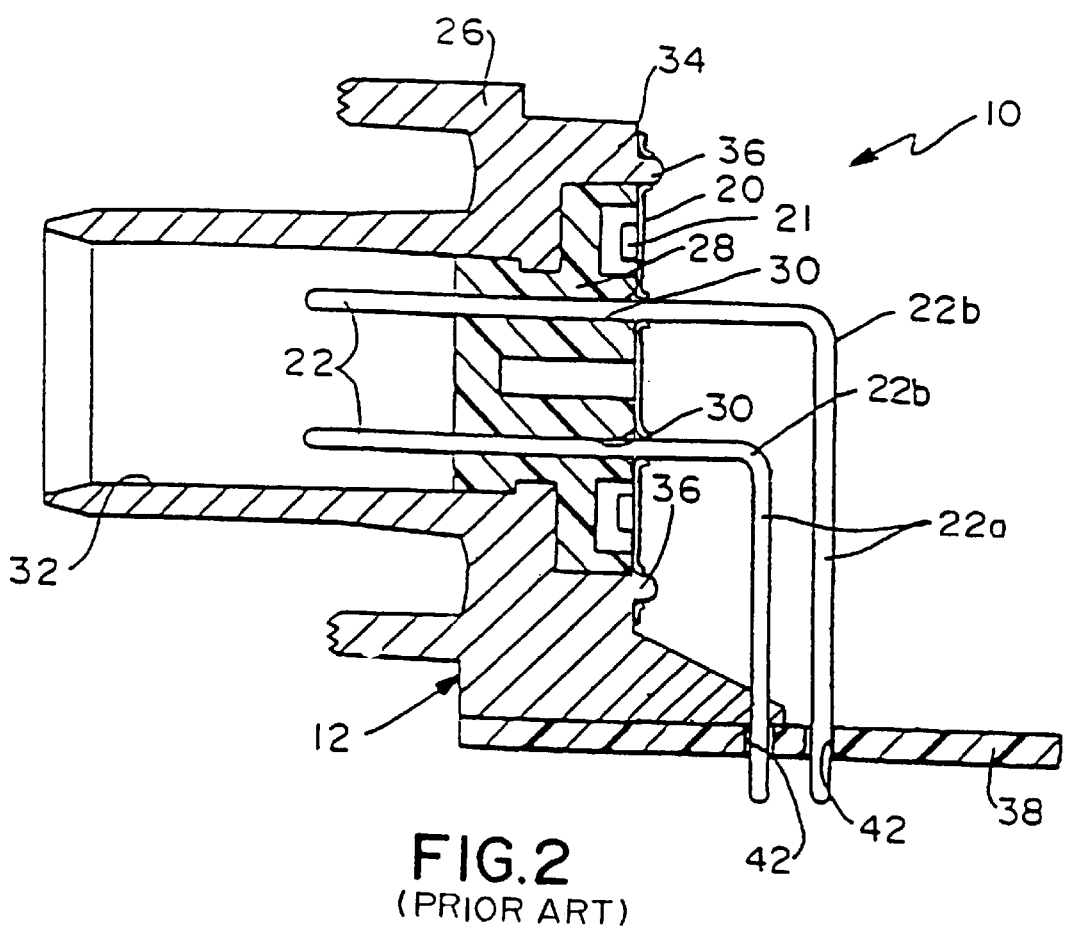
FIG. 2 is a vertical section, on an enlarged scale, through the connector assembly of FIG. 1 and with the assembly mounted to a printed circuit board.

FIGS. 1 and 2 show a prior art device such as is disclosed in U.S. Pat. No. 5,384,435. This device embodies a typical application in which the invention may be used, as set forth in more detail below. Accordingly, and first referring to FIGS. 1 and 2, the invention may be incorporated in a multi-terminal electrical connector assembly, generally designated 10. A pair of flexible capacitor filter circuits, generally designated 20, is mounted to the rear of connector 12, as described in greater detail hereinafter. A plurality of terminals 22 are mounted in connector 12 and are assembled, through flexible capacitor filter circuits 20, onto connector 12 when the flexible circuit is pressed over the pins in the direction of arrows "A". Each flexible capacitor filter circuit has a plurality of chip capacitors 21 operatively associated with the terminals passing therethrough. Each terminal 22 includes a tail portion 22a. For illustration purposes, FIG. 1 shows groups of terminals 22 retained on bandolier holders 24 which are used primarily for handling the terminals during plating and assembly. Although only sixteen terminals are shown in groups of four, connector 12 can mount as many as 80 terminals and similarly configured connector designs can mount 200 or more terminals.

Referring to FIG. 2 in conjunction with FIG. 1, connector 12 includes a housing 26 having a dielectric insert 28. The housing, through insert 28, includes a plurality of through passageways 30 for receiving terminals 22 whereby forward mating ends of the terminals are exposed in a cavity 32 of the housing. The cavity is provided for receiving a complementary electrical connector assembly (not shown) which includes female terminals for interengagement with terminals 22. Housing 26 defines a rear face 34 thereof, with a plurality of mounting pins 36 projecting from the rear face for insertion into mounting holes 37 in flexible capacitor filter circuits 20 to mount the circuits to the rear of the housing and establish electrical contact between the housing and the flexible circuits.

Still referring to FIG. 2 in conjunction with FIG. 1, it can be seen that connector 12, particularly housing 26, is constructed to provide a right angle connector mountable to a printed circuit board 38, with terminals 22 extending through passageways 30 generally parallel to the printed circuit board. It can be seen that terminals 22 are bent at right angles, as at 22b, so that tail portions 22a of the terminals extend perpendicular to printed circuit board 38 for insertion into appropriate holes 42 in the circuit board for interconnection to appropriate circuit traces on the board or in the holes. Terminals 22 may also be provided in a straight or vertical orientation to provide an in-line or vertical connector mountable to printed circuit board 38.

Figure 3:
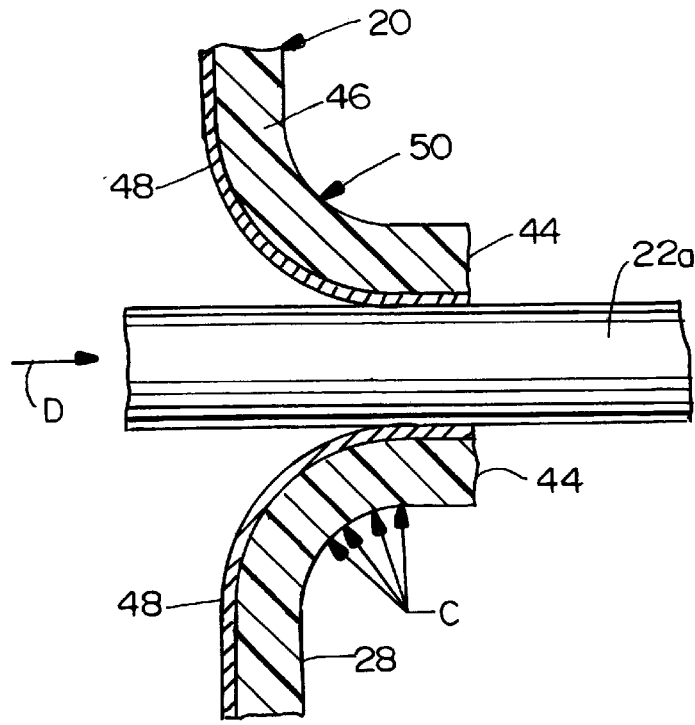
FIG. 3 an enlarged section through an interconnection between a terminal pin and a flat flexible circuit according to a system of the prior art.

Referring to FIG. 3, a generally round terminal pin 22, according to the prior art as set forth in U.S. Pat. No. 5,384,435, is inserted through a generally round hole 44 in flat flexible circuit 20. The flat flexible circuit includes a flat flexible dielectric substrate 46 having a ductile conductive film 48 thereon. Hole 44 initially is prepunched in the circuit. Substrate 46 is less than 0.050 inch thick. Terminal pin 22 is inserted through hole 44 to establish an electrical connection with conductive film 48.

The prior art system of FIG. 3 contemplates the use of a principle which may be called a "controlled meniscus" as indicated at 50 in FIG. 3. In other words, in order to eliminate the use of solder, adhesives, epoxies and the like, a particular interference is established between round terminal pin 22 and flat flexible circuit 20 in curved area 50 which, in essence, is a deformed peripheral area of the circuit that applies normal forces to the terminal pin in the direction of arrows "C" when the pin is inserted in the direction of arrow "D". It was found that this area and the interference forces are controlled by controlling the relative diameters of round terminal pin 22 and round hole 44. In actual practice, it was found that good electrical connections can be maintained when the difference between the diameter of terminal pin 22 and the diameter of hole 44 is on the order of 5% to 50% of the diameter of the hole. This may be termed the "interference" parameter.

The prior art system of FIG. 3 shows that secondary operations such as soldering the terminal pin to the flat conductor of the flat flexible circuit, or using epoxy or other adhesives between the pin and the flexible circuit can be completely eliminated and a good electrical connection between the pin and the flat conductor (film) of the flexible circuit can still be maintained. The subject invention however, as shown in subsequent FIGS. 5 through 8, is a further improvement on these concepts.

Figure 4:
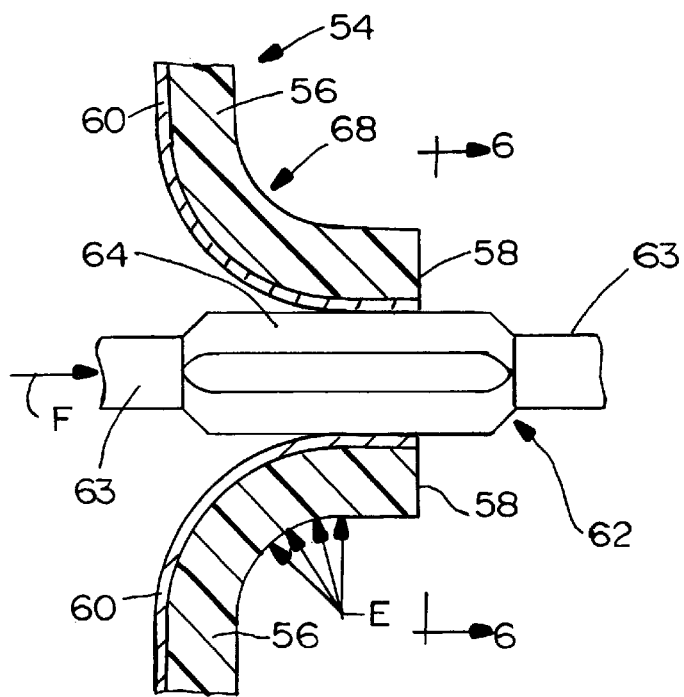
FIG. 4 is an enlarged section through an interconnection between a terminal pin and a flat flexible circuit according to the invention.
Figure 5:
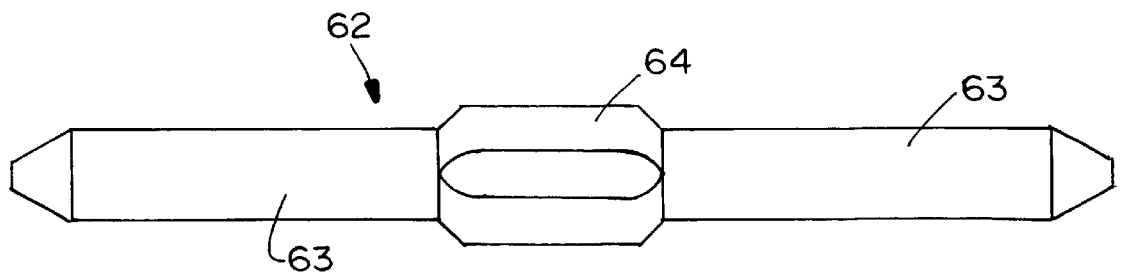
FIG. 5 is a planar view of a first embodiment of a terminal pin, removed from its connector assembly, for use in the invention.

More particularly, it has been found that pins which produce an interference fit within the holes of a flexible circuit can create problems by skiving the coatings or platings or the pins or the conductive film along the length of the pins during assembly and insertion. This is caused by the high normal forces generated by the interference fit between the smaller substrate hole diameter and the larger pin cross-sectional dimension. The present invention solves these problems in a system described below. FIG. 4 shows an electronic device or interconnection as might be applied with terminal pins in connectors such as connector 10 in FIGS. 1 and 2. In this system a flat flexible circuit, generally designated 54, again includes a flat flexible dielectric substrate 56 with a generally round hole 58 and with ductile conductive film 60 thereon. A terminal pin 62, such as is shown in FIG. 5, is inserted through hole 58 in substrate 56 to establish an electrical connection with conductive film 60. The terminal pin includes at least one end section 63 having a generally uniform round or rectangular cross-section wherein the given cross dimension of the end section defined by the diameter of the pin or between opposite diametral corners of the pin is less than the diameter of the hole in the substrate. Pin 62 further includes an enlarged contact section 64 located adjacent the end section adapted to make electrical contact with the conductive film on the substrate. The enlarged contact section 64 has a polygonal cross section wherein the cross dimension 65 between opposite outside diametral corners of the polygon or of the diameter defined by the outside dimensions of the polygon is greater than the diameter of the hole in the substrate. The terminal pin 62 is inserted into the substrate, end section first, to a depth such that the enlarged contact portion 64 of the pin is in contact with the conductive film of the substrate, creating a "controlled meniscus" interface. Specifically, the difference between the diameter defined by the outside cross-dimension of the enlarged contact portion 64 of the pin and the diameter of the round hole is on the order of 7% to 67% of the diameter of the hole.

Figure 6:
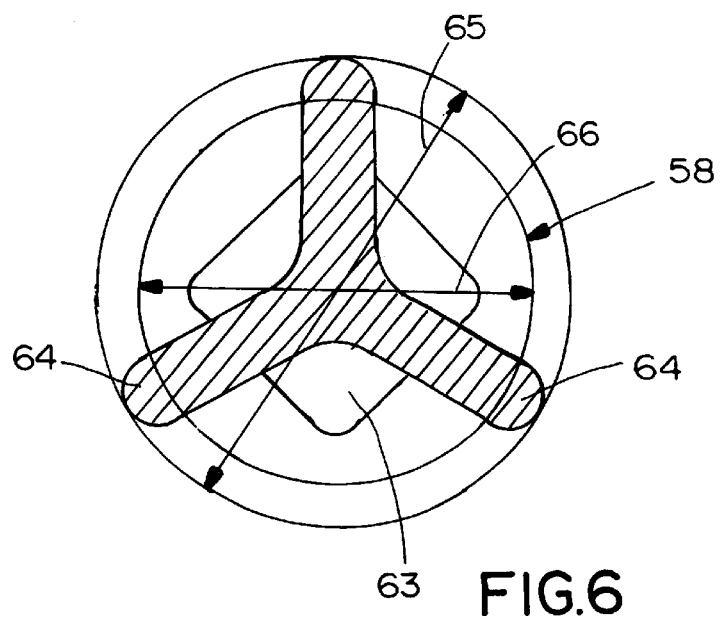
FIG. 6 is a sectional depiction of the first embodiment of the invention, showing a section taken generally along line 6—6 in FIG. 4.
Figure 7:
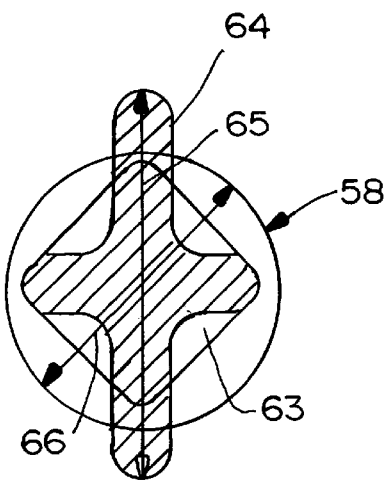
FIG. 7 a sectional depiction of a second embodiment of t invention, showing a section taken generally along line 6—6 in FIG. 4.
Figure 8:
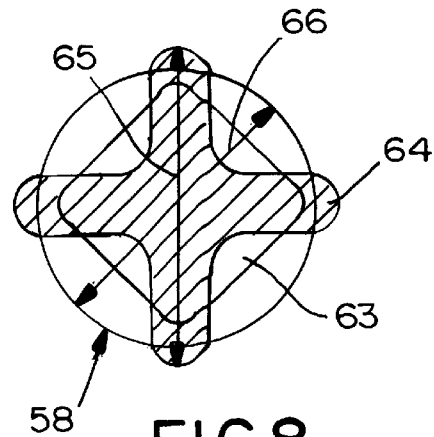
FIG 8 is a third embodiment of the invention, showing a section taken generally along line 6—6 in FIG. 4.

FIGS. 6, 7 and 8 illustrate the cross-dimension of the enlarged section of pin 62 used to define the interference between the pin and the flexible circuit. In FIG. 6, the diameter defined by the outside dimensions of the enlarged section 64 is represented by double-headed arrow 65. In FIGS. 7 and 8, the cross dimension of opposite diametral corners of enlarged section 64 of pin 62 is represented by double-headed arrow 65. The diameter of the round hole 58 in flexible substrate 56 is represented by double-headed arrow 66 in each of FIGS. 6–8. The smaller end section of the pin, identified at 63, is shown to be smaller in dimension than the hole 58 in the substrate, thereby avoiding skiving or scraping of plating or coating during assembly or insertion of the pin to the circuit. However, the difference between dimension 65 and dimension 66 is on the order of 7% to 67%. These parameters represent the "controlled meniscus" as indicated at 68 (FIG. 4) where the deformed peripheral area of the flexible circuit applies normal forces to the enlarged contact section of the terminal pin in the direction of arrows "E" when the pin is inserted in the direction of arrow "F" to a depth where the enlarged portion of the pin is in contact with the flexible circuit. Note that although the end sections shown in FIGS. 6, 7, and 8 are rectangular in shape, these end sections could have a variety of shapes such as circular or triangular. The particular cross section shown in FIG. 8 corresponds to the terminal configuration shown in FIG. 5.

The system of the invention not only overcomes the disadvantages of using solder and other substances such as conductive adhesives, but prevents skiving of coatings or platings on the pin or conductive film during assembly of the pin into the flexible circuit. The invention is particularly advantageous when terminal pin 62 is plated with a particular conductive material. If a terminal pin is inserted into a round hole in a flexible substrate, undue skiving can scrape the plating from areas of the pin and degrade solderability of the pin. The system and the parameters contemplated by the invention takes advantages of the relatively smaller end section of the pin to eliminate the skiving problem.

Conductive film 60 and the plating of terminal pin 62 may be of similar or dissimilar materials. For instance, conductive film 60 may be of copper material and the terminal pin can be plated with a pure tin or a tin/lead alloy. The copper film, itself, can be plated with a pure tin or tin/lead alloy, and the terminal pin can be plated with a similar tin or tin/lead alloy to form a similar metal interface, or the pin can be plated with a dissimilar metal such as nickel. Of course, other alloys can be used. Substrate 56 may be of various materials, such as a polyimide material or a polyester material.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An electronic device, comprising:
    a flat flexible dielectric substrate less than 0.050 inch thick and having a generally round hole of given diameter;
    a ductile conductive film on a surface of the substrate in an area at least about said hole; and
    a terminal pin inserted into the hole in the substrate, the terminal pin including at least one end section of a given length having a cross dimension less than the diameter of the hole in the substrate and an enlarged contact section of a given length located adjacent the end section, the enlarged contact section having a cross dimension greater than the diameter of the hole in the substrate and adapted to contact the ductile conductive film on the surface of the substrate,
    wherein a curved area is created at the interface of the substrate and the enlarged contact section and
    wherein the difference between the cross-dimension of the enlarged section of the pin and the diameter of the round hole is between 7% and 67% of the diameter of the hole.

2. The electronic device of claim 1 wherein the enlarged contact section of the pin is polygonal in cross section.

3. The electronic device of claim 1 wherein said terminal pin is plated with a conductive material.

4. The electronic device of claim 3 wherein said terminal pin is plated with one of a pure tin, pure nickel and a tin/lead alloy.

5. The electronic device of claim 1 wherein said substrate is fabricated of one of a polyimide and polyester material.

6. The electronic device of claim 1 wherein said hole in the substrate is a prepunched hole.

7. The electronic device of claim 1 wherein the at least one end section is round in cross section and the cross dimension of the said end section is defined by the dimension between opposite diameter corners of the end section.

8. The electronic device of claim 1 wherein the at least one end section is rectangular in cross section and the cross dimension of the said end section is defined by the dimension between opposite diametral corners of the end section.

9. The electronic device of claim 2 wherein the cross dimension of said enlarged contact section is defined by the dimension between opposite diametral corners of the polygon or by the diameter defined by the outside dimensions of the polygon.

10. The electronic device of claim 1 wherein said ductile conductive film is fabricated of copper.

11. The electronic device of claim 1 wherein said ductile conductive film and said terminal pin are plated with a common conductive plating material.

12. The electronic device of claim 1 wherein said ductile conductive film and said terminal pin are plated with dissimilar conductive plating materials.

13. The electronic device of claim 1 wherein the given length of the end section is greater than the given length of the enlarged contact section.

14. The electronic device of claim 1 wherein the given length of the end section is less than the given length of the enlarged contact section.

* * * * *